United States Patent
Tachioka et al.

(10) Patent No.: US 9,922,858 B2
(45) Date of Patent: Mar. 20, 2018

(54) SEMICONDUCTOR DEVICE MANUFACTURING METHOD

(71) Applicant: FUJI ELECTRIC CO., LTD., Kawasaki-shi (JP)

(72) Inventors: Masaaki Tachioka, Matsumoto (JP); Tsunehiro Nakajima, Matsumoto (JP)

(73) Assignee: FUJI ELECTRIC CO., LTD., Kawasaki-Shi (JP)

( * ) Notice: Subject to any disclaimer, the term of this patent is extended or adjusted under 35 U.S.C. 154(b) by 0 days.

(21) Appl. No.: 14/821,496

(22) Filed: Aug. 7, 2015

(65) Prior Publication Data
US 2015/0348818 A1    Dec. 3, 2015

Related U.S. Application Data

(63) Continuation of application No. PCT/JP2014/056887, filed on Mar. 14, 2014.

(30) Foreign Application Priority Data

Mar. 14, 2013    (JP) .................................. 2013-051647

(51) Int. Cl.
| | | |
|---|---|---|
| *H01L 21/683* | (2006.01) | |
| *B32B 37/14* | (2006.01) | |
| *B32B 37/18* | (2006.01) | |
| *B32B 38/10* | (2006.01) | |
| *B32B 7/12* | (2006.01) | |
| *B32B 9/04* | (2006.01) | |

(52) U.S. Cl.
CPC ............ *H01L 21/6835* (2013.01); *B32B 7/12* (2013.01); *B32B 9/04* (2013.01); *B32B 37/144* (2013.01);

(Continued)

(58) Field of Classification Search
CPC ....... H01L 21/6835; H01L 2221/68327; H01L 2221/68304; H01L 2221/68313; H01L 2221/68309; H01L 2221/68318; H01L 2221/38327; H01L 2221/6834; H01L 2221/6835; H01L 2221/68381;
(Continued)

(56) References Cited

U.S. PATENT DOCUMENTS 6,562,127 B1 *  5/2003  Kud ........................ C30B 33/06
                                                                117/915
2001/0054723 A1   12/2001  Narui et al.
(Continued)

FOREIGN PATENT DOCUMENTS

JP    H06-29385 A      2/1994
JP    2002-033458 A    1/2002
(Continued)

*Primary Examiner* — Carson Gross
(74) *Attorney, Agent, or Firm* — Rabin & Berdo, P.C.

(57) ABSTRACT

Provided is a semiconductor device manufacturing method that includes joining a support substrate to a back side of a semiconductor wafer across a ceramic adhesive layer and a mask, to form a joined body. The method further includes forming a functional structure on a front side of the semiconductor wafer. The method further includes detaching the support substrate from the semiconductor wafer by removing the ceramic adhesive layer and the mask. The method further includes a back side processing step of carrying out back side processing on the back side of the semiconductor wafer.

15 Claims, 8 Drawing Sheets

(52) U.S. Cl.
CPC .............. *B32B 37/18* (2013.01); *B32B 38/10* (2013.01); *B32B 2255/20* (2013.01); *B32B 2307/202* (2013.01); *B32B 2313/00* (2013.01); *B32B 2315/00* (2013.01); *B32B 2457/14* (2013.01); *H01L 2221/68327* (2013.01); *H01L 2221/68381* (2013.01); *Y10T 156/1111* (2015.01)

(58) Field of Classification Search
CPC ........... H01L 21/76254; B32B 2255/20; B32B 2307/202; B32B 2313/00; B32B 2315/00; B32B 38/10; B32B 2457/14; B32B 37/144; B32B 37/18; B32B 7/12; B32B 9/04; Y10T 156/11; Y10T 156/111
USPC ....................................................... 156/247
See application file for complete search history.

(56) References Cited

U.S. PATENT DOCUMENTS

| | | | |
|---|---|---|---|
| 2005/0233547 A1 | 10/2005 | Noda et al. | |
| 2005/0236693 A1* | 10/2005 | Kroninger | H01L 21/6835 257/619 |
| 2006/0046499 A1* | 3/2006 | Dolechek | H01L 21/6835 438/745 |
| 2009/0218560 A1* | 9/2009 | Flaim | H01L 21/6835 257/9 |
| 2009/0297867 A1 | 12/2009 | Katoh et al. | |
| 2011/0308739 A1* | 12/2011 | McCutcheon | H01L 21/187 156/766 |
| 2012/0034437 A1* | 2/2012 | Puligadda | H01L 21/2007 428/212 |
| 2014/0130969 A1* | 5/2014 | McCutcheon | B32B 7/06 156/247 |

FOREIGN PATENT DOCUMENTS

| | | |
|---|---|---|
| JP | 2003285263 A1 * | 10/2003 |
| JP | 2004-064040 A | 2/2004 |
| JP | 2004-140101 A | 5/2004 |
| JP | 2007-110015 A | 4/2007 |
| JP | 2009-155652 A | 7/2009 |
| JP | 2009-295695 A | 12/2009 |
| JP | 2010-226023 A | 10/2010 |

* cited by examiner

SEMICONDUCTOR DEVICE MANUFACTURING METHOD

CROSS-REFERENCE TO RELATED APPLICATIONS

This application is a continuation under 35 U.S.C. 120 of International Application PCT/JP2014/056887 having the International Filing Date of Mar. 14, 2014, and having the benefit of the earlier filing date of Japanese Application No. 2013-051647, filed Mar. 14, 2013. All of the identified applications are fully incorporated herein by reference.

TECHNICAL FIELD

The present invention relates to a semiconductor device manufacturing method that uses a method whereby a support substrate is attached to a semiconductor wafer.

BACKGROUND ART

In recent years, there has been swift progress in the reduction in size and increase in density of semiconductor devices. Together with this, there is demand for a reduction in the thickness of semiconductor elements used in the devices, and a need for the thickness of a semiconductor wafer to be 100 µm or less is occurring. When grinding the thickness of a semiconductor wafer to 100 µm or less, or forming a device using a semiconductor wafer of 100 µm or less, warping occurs due to the strength of the semiconductor wafer being insufficient, because of which it is not possible to grind a single semiconductor wafer, or to form a device. Therefore, in order to prevent warping from occurring by reinforcing the strength of the semiconductor wafer, technology whereby a support substrate is bonded to the semiconductor wafer, and grinding or device formation carried out, has been developed.

As technology whereby a support substrate is bonded to a semiconductor wafer, there is, for example, technology whereby a semiconductor wafer is attached to a support substrate using an organic adhesive such as a polyimide or epoxy resin, or wax with a low melting point (PTL 1, 2). This technology is such that a semiconductor wafer is fixed to a support substrate using an organic adhesive or a wax with a low melting point, and thinning carried out by grinding or device formation. After the grinding or device formation, the organic adhesive is degraded by light irradiation, or the wax melted by applying heat, and the semiconductor wafer is detached from the support substrate.

Other than the organic adhesive or the wax with a low melting point, technology whereby a semiconductor wafer is fixed to a support substrate using a protective tape is also proposed as technology whereby a support substrate is bonded to a semiconductor wafer (PTL 3).

As one example of existing technology, the following is a process flow of a semiconductor device manufacturing method including a step of joining a support substrate to a semiconductor wafer using an organic adhesive. The flow of the process is preparation of a semiconductor wafer, forming a semiconductor wafer front side structure, joining a support substrate to the front side of the semiconductor wafer, thinning the semiconductor wafer, forming aback side structure, detaching the support substrate, and dicing. As the semiconductor wafer, a wafer with a thickness of 600 µm to 700 µm is common. An ion implantation into the front side, a diffusion of long duration at approximately 1,000° C., and a formation of a gate structure and front side electrode are carried out as the formation of the front side structure. The joining of the support substrate is carried out by bonding a support substrate of the same form as the semiconductor wafer using an organic adhesive. The thinning of the semiconductor wafer is carried out by grinding and etching the back side of the semiconductor wafer after joining the support substrate. The semiconductor wafer after thinning has a thickness of approximately 100 µm. An ion implantation into the back side, impurity activation by thermal processing, and formation of a back side electrode are carried out as the formation of the back side structure. The detachment of the support substrate is carried out by heating the organic adhesive joining the semiconductor wafer and support substrate, or degrading by irradiating the organic adhesive with ultraviolet light. The dicing is a step of cutting out integrated circuits, or the like, formed on the semiconductor wafer in accordance with the steps to date by cutting the semiconductor wafer with a dicing saw, thereby forming chips.

Also, technology whereby a semiconductor wafer is fixed to a support substrate using a heat resistant adhesive is also proposed as technology whereby a support substrate is bonded to a semiconductor wafer (PTL 4).

CITATION LIST

Patent Literature

PTL 1: JP-A-2004-64040
PTL 2: JP-A-6-29385
PTL 3: JP-A-2004-140101
PTL 4: JP-A-2009-295695

SUMMARY OF INVENTION

Technical Problem

The polyimide used as the organic adhesive is resistant to a temperature of 400° C. or lower, while the epoxy resin is resistant to a temperature of in the region of 200° C. Also, the wax with a low melting point is resistant to a temperature of 100° C. or lower. Consequently, when it is necessary to fabricate a semiconductor device via steps including high temperature processing with in the region of 1,000° C. as a diffusion temperature, this kind of organic adhesive and wax with a low melting temperature cannot be used, as it is not possible to maintain state wherein the semiconductor wafer remains attached to the support substrate during the high temperature processing.

Meanwhile, the protective tape too, in the same way as the adhesive, has a problem with heat resistance, and is not suited to fabrication of a semiconductor device including the heretofore described kind of high temperature processing. Also, in the case of the protective tape, there is concern that when detaching the protective tape, the adhesive strength thereof will cause cracking or chipping of the semiconductor wafer.

Also, a heat resistant adhesive is also being considered, but the method described in PTL 4 is such that, in order to detach the adhesive, thermal processing at a temperature exceeding the temperature applied when processing the device is necessary. However, when carrying out thermal processing at a temperature equal to or higher than that of the diffusion process on a semiconductor substrate for which a diffusion process at a predetermined temperature is completed, the impurity concentration profile is changed, because of which it is not possible to carry out thermal processing at a temperature equal to or higher than that of the diffusion process.

The invention having been contrived bearing in mind the heretofore described points, an object of the invention is to provide a semiconductor device manufacturing method such that it is possible to maintain a state wherein a semiconductor wafer remains attached to a support substrate, even during a high temperature processing.

Solution to Problem

In order to resolve the heretofore described problem, the inventor has given serious consideration to a semiconductor device manufacturing method applicable to high temperature processing. As a result of this, it is found that a semiconductor device manufacturing method is applicable to high temperature processing provided that a support substrate is attached to a semiconductor wafer using a ceramic adhesive. Also, it is found that by the attached ceramic adhesive being detached, it is possible to manufacture a semiconductor device via steps including a high temperature processing. On obtaining these findings, the inventor conceived of the invention.

That is, the invention is a semiconductor device manufacturing method, including at least a back side joining step of joining a support substrate to the back side of a semiconductor wafer across a ceramic adhesive layer and a mask, forming a joined body, a functional structure formation step of forming a functional structure on the front side of the semiconductor wafer, a detachment step of detaching the support substrate from the semiconductor wafer by removing the ceramic adhesive layer and mask, and a back side processing step of carrying out back side processing on the back side of the semiconductor wafer.

Advantageous Effects of Invention

According to the invention, it is possible to provide a semiconductor device manufacturing method applicable to a high temperature processing at in the region of 1,000° C.

DESCRIPTION OF EMBODIMENTS

Hereafter, a description will be given of one aspect of an embodiment of the invention. The invention is not, however, limited by the embodiment described hereafter.

A semiconductor device manufacturing method of the invention includes at least a back side joining step, a functional structure formation step, a detachment step, and a back side processing step.

Figure 3:
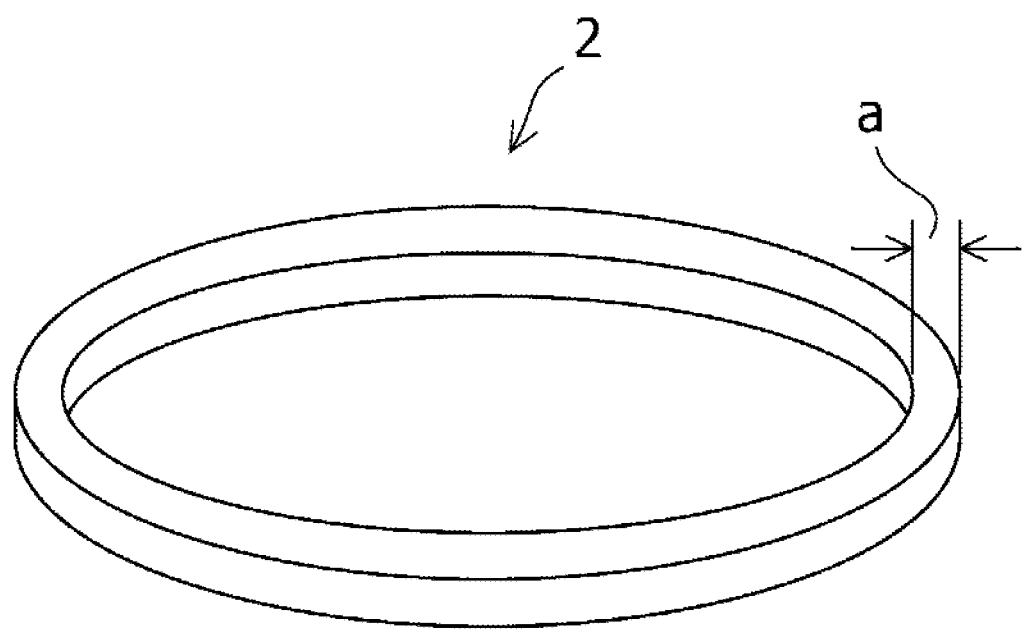
FIG. 3 is a perspective view of a mask.

The back side joining step is a step wherein a support substrate is joined to the back side of a semiconductor wafer across a ceramic adhesive layer and a mask, forming a joined body. The support substrate is joined so that no deformation or warping occurs in the semiconductor wafer due to high temperature heating, or the like, when forming a functional structure. A ceramic adhesive is used in order to ensure sufficient adhesiveness between the semiconductor wafer and support substrate during the process of forming the functional structure too. The ceramic adhesive can be applied to either the semiconductor wafer or support substrate, and can also be applied to both the semiconductor wafer and support substrate. In this step, by using a mask, the application of the ceramic adhesive to the semiconductor wafer or support substrate is facilitated, and it is possible to prevent the applied ceramic adhesive from spilling out from the sides of the ceramic adhesive layer. Also, it is possible to even the thickness of the ceramic adhesive layer using the mask so that no focus deviation occurs during photo-processing in the functional structure formation step. Provided that this kind of advantage can be obtained, the form of the mask is not particularly limited, but it is preferable that the mask is of a frame form such that encloses the region in which the adhesive is applied. For example, a mask of a ring form that covers an outer peripheral portion of the back side of the semiconductor wafer, or the like, as shown in FIG. 3, is usable as a form. The sectional form of the frame form or ring form mask may be either circular or quadrilateral. The form will be described hereafter. It being sufficient that the material of the mask is a material having heat resistance applicable to a high temperature processing at 800° C. to 1,200° C., tungsten or molybdenum, for example, are usable as mask materials. Tungsten and molybdenum are preferable as they do not oxidize easily, and have excellent durability at high temperatures. Also, the mask material may also be quartz or a ceramic such as alumina, or the material may be such that tungsten or molybdenum is formed on a surface of the ceramic or the like. Depending on the mask material, the ceramic adhesive also adheres to the mask. Also, when the mask is of a frame form or ring form, the surface in contact with the support substrate or wafer may have a groove. It is desirable that the groove is formed so to be gouged into the frame or ring from the inner side toward the outer side. Also, the groove may also be provided so as to penetrate the interior of the frame or ring from the inner side to the outer side. Owing to this kind of groove or through hole, moisture in the ceramic adhesive is easily discharged. Also, when detaching the support substrate, hot water seeps easily into the adhesive, and detachment is carried out well. Also, the mask may also be of a divided form.

Herein, a manufacturing step according to the semiconductor device manufacturing method of the invention is such that, when the thickness of the semiconductor wafer on being introduced into the step is greater than the finished thickness of the design, a thinning step for reducing the thickness of the semiconductor wafer can be provided after the back side joining step. The thinning step is such that grinding or polishing is carried out on the front side of the semiconductor wafer, to which the support substrate is not bonded, wherein the thickness of the semiconductor wafer is reduced in comparison with the original thickness. The front side of the semiconductor wafer, to which the support substrate is not bonded, is processed to be flat so that the functional structure can be formed in the following functional structure formation step.

The functional structure formation step is a step wherein the functional structure is formed on the front side of the semiconductor wafer. This step includes steps including, for example, a guard ring formation step wherein a p-well and oxide film are formed, a gate formation step wherein a channel region ion implantation and thermal processing, an oxide film removal, a trench formation, a gate oxide film formation, and polysilicon layer formation are carried out, an emitter formation step wherein an n-type impurity ion implantation and thermal processing are carried out, a contact formation step wherein a p-type impurity ion implantation and thermal processing, interlayer dielectric formation, and electrode formation are carried out, and the like.

The detachment step is a step wherein the ceramic adhesive layer and mask are removed, thus detaching the support substrate from the semiconductor wafer. When reinforcement of the semiconductor wafer by the support substrate becomes unnecessary, it is possible to remove the support substrate from the semiconductor wafer in this step. Herein, the mask, while adhering to the ceramic adhesive, does not adhere to the semiconductor wafer or support substrate. Because of this, it is also possible to remove the mask by the step of detaching the ceramic adhesive layer.

The back side processing step is a step wherein a back side processing is carried out on the back side of the semiconductor wafer. This step includes steps including an ion implantation and thermal processing, an electrode formation, and the like. Also, back side polishing, or the like, may also be carried out.

The semiconductor device manufacturing method of the invention is such that the detachment step can be a step wherein the joined body of the semiconductor wafer and support substrate is washed with water or immersed in water, and the mask and ceramic adhesive layer are removed. For example, when the ceramic adhesive layer is formed using a paste form ceramic adhesive having water as a main solvent, including an additive such as an alkali metal salt or silicate soluble in water, it is possible, by immersing the joined body in water, to cause the ceramic adhesive to diffuse in the water. By immersing in water, adhesive strength is reduced, and by sliding the support substrate, it is possible to detach the support substrate from the semiconductor wafer. The ceramic adhesive is such that an additive such as an alkali metal salt or silicate soluble in water covers the perimeter of particles (ceramic particles) of an inorganic oxide chosen from $Al_2O_3$, $SiO_2$, $ZrO_2$, or a mixture thereof. When there is moisture, the additive dissolves, and the particles separate. Meanwhile, when there is dehydration due to heating, the additive precipitates and takes shape, causing the ceramic particles to bind. Therefore, when immersing in water, the alkali metal salt or silicate, which is the additive, dissolves in the water, the binding force between the ceramic particles weakens, and the particles separate. Further, the ceramic particles disperse in water or the like. The detachment is facilitated by using hot water of 50° C. to 100° C., or more preferably, 80° C. to 90° C. Also, ultrasonic may be applied at this time. Further, it is possible to dispose the junction plane parallel with an ultrasonic diaphragm. This is because the ceramic particles are separated by oscillation, and furthermore, the hot water seeps in more easily. Further, the diaphragm is installed so as to oppose the support substrate. However, in the case of a ring form support substrate, it is desirable that a protective plate, or the like, of metal, a ceramic, or the like is installed so that the ultrasonic does not act directly on the functional structure portion of the wafer back side or front side. In order to attenuate the ultrasonic intensity, so as not to damage the functional structure portion, it is preferable that the thickness of the protective plate is 1 mm or more. Also, the diaphragm may be disposed so as to oppose the mask side surfaces. In this case, there is action such that promotes the seeping of the hot water into the interior of the ceramic junction portion. It is possible to use ultrasonic of a frequency from 15 kHz to several MHz. Also, in order to promote entry of the hot water into the interior of the ceramic junction portion, a surfactant of 0.1% by mass to 5% by mass may be added to the hot water. This is so that the wetness of the ceramic particle surfaces is increased by the surfactant, and entry of the hot water is thus facilitated.

The semiconductor device manufacturing method of the invention is such that it is preferable that the ceramic adhesive includes an inorganic oxide chosen from $Al_2O_3$, $SiO_2$, $ZrO_2$, or a mixture thereof. This is because ceramic adhesives including these inorganic oxides have good adhesion with the semiconductor wafer and support substrate, and have heat resistance applicable to processing at a high temperature of 800° C. to 1,200° C.

A paste form adhesive including the inorganic oxide particles and an additive having the role of promoting the binding of the inorganic oxide particles, and having water as the main solvent, is usable as the ceramic adhesive. It being sufficient that the additive is a salt soluble in water, it is good when the additive is an alkali metal or alkaline earth metal chloride, hydroxide, carbonate, sulfate, nitrate, silicate, or the like, and is soluble in water. In particular, an alkali metal salt or silicate soluble in water is preferable, as it has good binding between ceramic particles, and diffusion of the ceramic particles to the solvent is also good. In the case of a paste form adhesive, it is preferable that the amount of additive contained is 1% by weight to 30% by weight. Also, for the sake of even application, it is preferable that the viscosity is 10,000 to 100,000 mPa·s (20° C.). Further, it is possible to use the adhesive diluted as appropriate with water, or the like, so as to reach the above-mentioned viscosity. However, this is not limiting, provided that the adhesive is a ceramic adhesive that has good adhesion with the semiconductor wafer and support substrate, and satisfactory heat resistance.

Also, it is useful when the inorganic oxide included in the ceramic adhesive is such that the average particle diameter (D50) is smaller than the thickness (d) of the mask. Specifically, it is preferable that the inorganic oxide has an average particle diameter that satisfies the condition $\frac{1}{10}d < D50 < d$. When the particle diameter is large, adhesion decreases, and when the particle diameter is too small, it is difficult for the hot water to enter when detaching, which is not desirable.

As an example of using the paste form ceramic adhesive having water as the main solvent, there is a usage example whereby a ceramic adhesive diluted with water so as to reach a viscosity suited to application is applied to the semiconductor wafer and, after bonding to the support substrate, moisture is caused to evaporate using thermal processing, thereby hardening the adhesive. As the additive, such as an alkali metal salt, on the periphery of the ceramic particles is an ionic crystal, at least one portion dissolves in the water in a state in which water remains, and exists as ions. After the water evaporates, however, the additive precipitates on the periphery of the ceramic particles. This is shared by adjacent ceramic particles, and contributes to the bonding of these ceramic particles. The same applying to an Si wafer, bonding is performed by an additive such as an alkali metal salt precipitating between the Si wafer surface and the ceramic particles. It is preferable that the heating temperature at this time is 80° C. to 200° C. Holes may exist in a ceramic adhesive layer obtained in this way. The hole abundance ratio can be changed by regulating conditions such as the ceramic particle diameter, water dilution ratio, and heating temperature. When considering adhesion and detachability, it is desirable that the hole abundance ratio is 20% or more by volume.

The semiconductor device manufacturing method of the invention can include, before the back side processing step, a front side joining step wherein a ring form support substrate is joined to an outer peripheral region, in which the functional structure is not formed, of the front side of the semiconductor wafer. According to this step, it is possible to prevent deformation and warping of the semiconductor wafer, which it is feared will occur due to the back side processing. There is a region of the front side of the semiconductor wafer in which the functional structure is formed, and when the support substrate is joined to this region, there is concern that the functional substrate will be destroyed. Therefore, by joining the ring form support substrate to the outer peripheral region of the semiconductor wafer in which the functional structure is not formed, the semiconductor wafer is reinforced.

In the front side joining step, the joining of the ring form support substrate can be carried out with a ceramic adhesive including an inorganic oxide chosen from $Al_2O_3$, $SiO_2$, $ZrO_2$, or a mixture thereof. Provided that it is a ceramic adhesive, it is possible to ensure sufficient adhesiveness between the semiconductor wafer and support substrate during the process of processing the back side too. The ceramic adhesive can be applied to either the semiconductor wafer or support substrate, and can also be applied to both the semiconductor wafer and support substrate. Also, it is also possible to apply a ceramic adhesive by using a mask in the same way as in the back side joining step. Also, it is also possible to use an organic adhesive such as a resin for the adhesion of the front side support substrate, provided that the adhesive is resistant to the hot water or chemical used in the step of forming the back side structure.

The semiconductor device manufacturing method of the invention is such that it is preferable that the thickness of the ceramic adhesive layer is 50 μm to 200 μm. When joining the semiconductor wafer and support substrate directly, with no intervening ceramic adhesive layer or the like, it is necessary that the surface roughness of the semiconductor wafer and support substrate is smooth at the atomic level. Because of this, the semiconductor wafer and support substrate pass through a precision polishing process such as an atomic beam before joining, in order to smooth the surfaces. However, by interposing a ceramic adhesive layer, the ceramic adhesive layer having a certain thickness means that even when there is slight unevenness in the front side or back side of the semiconductor wafer, or front side of the support substrate, or the like, and it is not a uniform smooth surface, it is possible to attach so that the front side of the semiconductor wafer, and the like, is horizontal, so that no focus deviation occurs during the photo-processing. Provided that the thickness of the ceramic adhesive layer is around 100 μm, it is possible for the front side of the semiconductor wafer to be sufficiently horizontal even when bonding a semiconductor wafer and support substrate with unevenness. The thickness of the ceramic adhesive layer can be set by regulating the thickness of the mask. For example, by setting the thickness of the mask to 100 μm, it is possible to set the thickness of the ceramic adhesive layer to 100 μm too. When not using a mask, it is possible to regulate the thickness by the amount of ceramic adhesive layer applied.

The semiconductor device manufacturing method of the invention is such that, not being limited to an Si wafer, an SiC wafer or GaN wafer can be employed as the semiconductor wafer.

The semiconductor device manufacturing method of the invention is such that it is possible to use a semiconductor wafer such that the thickness of the semiconductor wafer before the back side joining step is less than 300 μm for a six inch diameter and less than 400 μm for an eight inch diameter. To date, a semiconductor wafer with a thickness of 600 μm to 700 μm has commonly been used in order to prevent deformation or warping from occurring in the semiconductor wafer due to the formation of the functional structure. With the manufacturing method of the invention, the semiconductor wafer is reinforced by the support substrate being joined thereto, because of which it is possible to use the heretofore described kind of semiconductor device, which is thinner than that heretofore known. Provided that the thickness of the semiconductor wafer is less than 300 μm for a six inch diameter and less than 400 μm for an eight inch diameter, there is no need to carry out excessive polishing by chemical mechanical polishing, or the like, in order to thin the wafer, because of which it is possible to considerably reduce the wafer cost. Also, the thickness of the semiconductor wafer at the point of finishing the semiconductor device can be selected in accordance with the required characteristics of the semiconductor device. For example, the thickness is several tens of micrometers to 200 μm.

The semiconductor device manufacturing method of the invention is such that it is preferable that the support substrate is a substrate chosen from highly heat resistant glass, Si wafer, Si wafer having a silicon oxide film layer on the surface, or SiC wafer. This is because, provided that it is one of these substrates, it has good adhesion with the ceramic adhesive, and can sufficiently augment the reinforcement of the semiconductor wafer. Also, the form of the support substrate used in the back side joining is not particularly limited. When the wafer is of a disc form, it is possible to use a support substrate of a form such as a disc form or ring form in accordance with the wafer form. Also, in the case of front side joining, it is desirable that the form of the support substrate is a ring form. This is because it is possible to arrange that there is no effect on the functional structure portion formed on the front side. Also, regarding the thickness of the support substrate, a thicker substrate can augment the reinforcement of the semiconductor wafer, but an excessively thick support substrate may cause an impediment to conveying between manufacturing devices or to handling inside a manufacturing device. Consequently, it is possible to use a support substrate such that the thickness of the joined body after bonding the semiconductor wafer and support substrate is the thickness (for example, 600 μm to 700 μm) of a general semiconductor wafer when introduced. Also, the support substrate can be repeatedly used in the reinforcement of the semiconductor wafer.

Next, referring to the drawings, a more specific description will be given of the embodiment of the semiconductor device manufacturing method of the invention. In this case, the invention is not limited by the embodiment for which reference is made to the drawings.

(First Embodiment)

Figure 1:
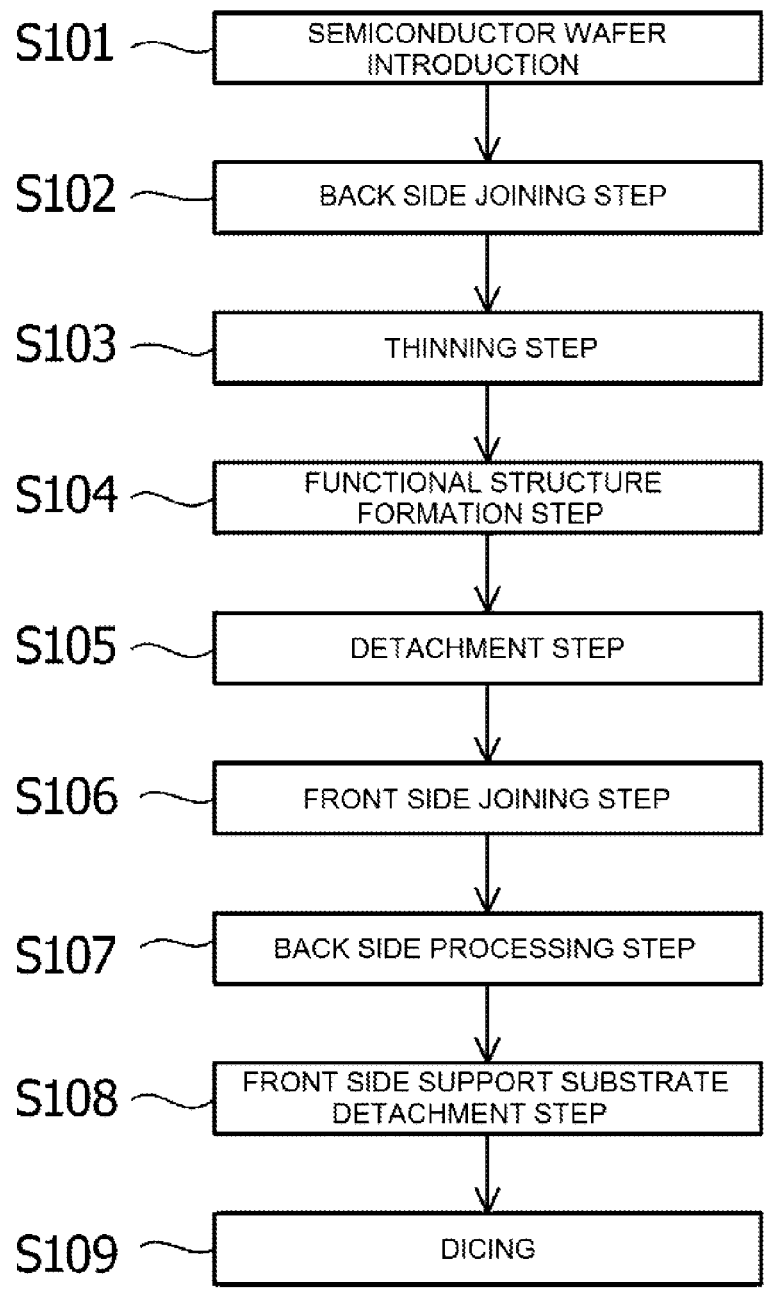
FIG. 1 is a process flow showing one example of a semiconductor device manufacturing method of the invention.

FIG. 1 is a process flow showing one example of the semiconductor device manufacturing method of the invention. In step S101 of FIG. 1, a semiconductor wafer is introduced into the manufacturing step. The semiconductor wafer is a wafer made of Si, and the thickness thereof is 500 µm for a six inch diameter. As a support substrate is bonded to the semiconductor wafer in a back side joining step of the next step S102, it is possible for the thickness of the semiconductor wafer when introduced into the manufacturing step to be less than 500 µm. For example, it is possible to introduce a semiconductor wafer of a thickness of in the region of 300 µm. In this way, by using a semiconductor wafer whose thickness when introduced into the manufacturing step is small, it is possible to reduce the amount of Si removed in the thinning step, to be described hereafter.

Next, in the back side joining step of step S102, a support substrate is joined to the backside of the semiconductor wafer across a ceramic adhesive layer and a mask, forming a joined body. The support substrate is joined so that no deformation or warping occurs in the semiconductor wafer due to high temperature heating, or the like, when forming a functional structure.

Next, the semiconductor wafer is thinned in a thinning step of step S103. The thickness of the semiconductor wafer at a finishing point at which a semiconductor device is formed in the semiconductor wafer is in the region of 40 µm to 120 µm, in accordance with the breakdown voltage of the semiconductor device. Herein, it is necessary that the thickness of the semiconductor wafer is less than (thinned beyond) the thickness of the semiconductor wafer when introduced into the manufacturing step. In the thinning step, processing for reducing the thickness of the semiconductor wafer when introduced into the manufacturing step to a predetermined thickness is carried out. As a processing method, grinding may be carried out by applying a grindstone to the surface of the semiconductor wafer to which the support substrate is not attached, or CMP (Chemical Mechanical Polishing) may be used. However, it is necessary that the surface of the semiconductor wafer to which the support substrate is not attached is processed to be smooth so that a functional structure can be formed in the next step.

Next, in a functional structure formation step of step S104, a functional structure is formed on the front side of the semiconductor wafer. As this step, there is, for example, a step wherein a deep diffusion layer is formed. For example, when forming an IGBT (insulated gate bipolar transistor) as the semiconductor device, a p-type diffusion layer (p-type base region) is formed on the front side of the semiconductor wafer. An implantation of impurity ions is selectively carried out into a formation region of this kind of diffusion layer, and continuing, thermal processing is carried out at 1,000° C. for several hours, thereby causing the impurity to diffuse. As it is necessary that the p-type diffusion layer diffuses to a depth of in the region of 10 µm from the surface on the front side of the semiconductor wafer, a high temperature thermal processing of long duration is necessary.

The invention is such that, as the thinned semiconductor wafer is fixed to the support substrate with a ceramic adhesive, there is no problem of the semiconductor wafer breaking, or the like, even when being conveyed between manufacturing devices when carrying out ion implantation or thermal processing. Also, as the ceramic adhesive is heat resistant, there is no detachment of the semiconductor wafer, even when carrying out a thermal processing exceeding 1,000° C.

Steps such as an ion implantation and thermal processing for forming a channel region, trench formation, gate oxide film formation, formation of an emitter region by an n-type impurity ion implantation and thermal processing, interlayer dielectric formation, and electrode formation are also included in the functional structure formation step of step S104.

On the functional structure being formed on the front side of the semiconductor wafer, the process proceeds next to a semiconductor wafer back side processing step, but before that, the support substrate is detached from the semiconductor wafer by removing the ceramic adhesive layer and mask in a detachment step of step S105. A method of detaching the ceramic adhesive layer is such that, for example, when forming the ceramic adhesive layer using a paste form ceramic adhesive having water as the main solvent and including an inorganic oxide and an alkali metal salt, the semiconductor wafer to which the support substrate is attached is immersed in water, whereby the ceramic adhesive is caused to diffuse in the water.

A ceramic adhesive layer is formed between the semiconductor wafer and support substrate, but as a mask is interposed in an outer peripheral portion of the semiconductor wafer, there is no adhesive layer between the mask and semiconductor wafer, and between the mask and support substrate. Because of this, water enters from between the mask and semiconductor wafer, and between the mask and support substrate, which can easily cause the adhesive strength to decrease. It is possible to detach the support substrate from the semiconductor wafer by sliding the support substrate. The detachment is facilitated by using hot water of 50° C. to 100° C., or more preferably, 80° C. to 90° C.

Next, in a front side joining step of step S106, a support substrate differing from that on the back side is joined by bonding to the front side of the semiconductor wafer. The front side support substrate is for preventing damage to the already formed front side functional structure due to fixing the front side of the semiconductor wafer to a manufacturing device when forming a back side structure in a step to be described hereafter. It is sufficient that a material that can withstand the step of forming the back side structure is used for the front side support substrate. Also, provided that it can withstand the temperature and chemicals used in the step of forming the back side structure, it is possible to use an organic adhesive such as a resin for the attachment of the front side support substrate.

Next, a back side structure is formed in a back side processing step of step S107. Steps such as an ion implantation and thermal processing for forming a back side semiconductor region (for example, a collector region), and electrode formation, are included as steps of forming the back side structure. When not carrying out the same kind of high temperature processing of long duration for the back side semiconductor region formation as when forming the deep diffusion layer on the front side, it is possible to use an organic adhesive such as a resin when attaching the support member to the semiconductor wafer front side. Also, polishing or the like may be carried out before forming the back side structure.

Next, the front side support substrate is detached in a front side support substrate detachment step of step S108. For example, it is possible to use an adhesive whose adhesive strength can be eliminated by ultraviolet irradiation, or an adhesive whose adhesive strength can be eliminated by heating. Next, in a dicing of step S109, the semiconductor wafer is cut using a dicing saw or the like, thereby fragmenting the semiconductor device.

According to the first embodiment, it is possible to use a semiconductor wafer such that the wafer thickness when the semiconductor wafer is introduced is small in comparison with that heretofore known, because of which it is possible to reduce the amount of semiconductor wafer material discarded due to grinding in the thinning step or the like. Also, even when using a semiconductor wafer of low thickness, the thermal processing temperature of the front side diffusion layer formation step can be withstood owing to the reinforcing effect of the support substrate, and it is thus possible to prevent deformation and warping of the semiconductor wafer.

(Second Embodiment)

A second embodiment, in the same way as the first embodiment, is an embodiment wherein a semiconductor device is manufactured in accordance with the process flow of FIG. 1. However, the front side joining step of step S106 and the front side support substrate detachment step of step S108 differ from those of the first embodiment.

In the front side joining step of step S106, a ceramic adhesive is applied to, for example, a ring form support substrate (made of, for example, heat resistant glass), and the support substrate is attached to the semiconductor wafer front side, on which the functional structure is formed. When it is not possible to use an organic adhesive together with the high temperature processing of long duration when forming the back side structure, it is possible to use a ceramic adhesive. The outer diameter of the ring form support substrate is the same as the outer diameter of the semiconductor wafer. On the front side of the semiconductor wafer, there is an outer peripheral region in which no device is formed on the outer periphery of the device formation region, and the width of a ring form bonding side of the ring form support substrate is of the same extent as the width of the outer peripheral region, so as not to affect the device. Also, the thickness of the ring form support substrate is, for example, 300 μm, a thickness of an extent that can maintain the strength of the semiconductor wafer being sufficient.

The ring form support substrate is joined to the front side of the semiconductor wafer across the ceramic adhesive, and the ceramic adhesive is hardened by a thermal processing being carried out at 100° C. for two hours, removing the moisture from the ceramic adhesive layer. A ceramic adhesive having alumina ($Al_2O_3$) as a main element, a ceramic adhesive having silica ($SiO_2$) as a main element, or a ceramic adhesive having zirconia ($ZrO_2$) as a main element can be applied as the adhesive. As the ring form support substrate is joined to the outer peripheral region of the semiconductor wafer, in which no device is formed, no damage is caused by the attachment of the ring form support substrate to the already formed front side functional structure.

In the front side support substrate detachment step of step S108, the ring form support member joined to the front side of the semiconductor wafer is detached. In the same way as in the detachment step of step S105 of the first embodiment, for example, when the ceramic adhesive layer is formed using a paste form ceramic adhesive having water as a main solvent, including an inorganic oxide and alkali metal salt, it is possible, by immersing the semiconductor wafer to which the support substrate is joined in water, to cause the ceramic adhesive to diffuse in the water. A ceramic adhesive layer is formed between the semiconductor wafer and support substrate, but water enters from the outer peripheral side and inner peripheral side of the ring form support member, which can easily cause the adhesive strength to decrease. The detachment is facilitated by using hot water of 50° C. to 100° C., or more preferably, 80° C. to 90° C.

(Third Embodiment)

The invention is also applicable to, for example, the following kind of embodiment as an embodiment using a ring form support substrate.

Herein, in step S101 of FIG. 1, a semiconductor wafer whose front side has undergone a mirror polishing process is introduced into the manufacturing step. The semiconductor wafer is a wafer made of Si, and has a thickness of 300 μm for a six inch diameter. As the front side has undergone a mirror polishing process, it is possible to start front side processing immediately after introduction into the manufacturing step. The thinning step or mirror polishing process may also be performed on the front side.

As a support substrate is bonded to the semiconductor wafer in the back side joining step of step S102, it is possible to reduce the thickness of the semiconductor wafer when introduced into the manufacturing step. In this way, by using a semiconductor wafer whose thickness when introduced into the manufacturing step is small, it is possible to omit the thinning step, or reduce the amount of Si removed in the thinning step.

Figure 8:
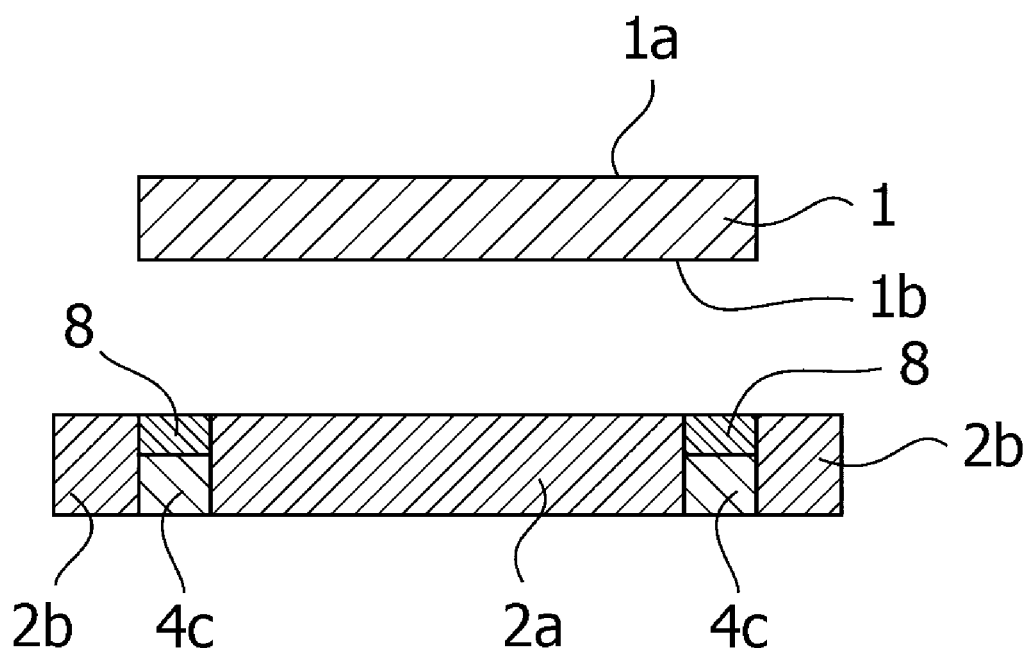
FIG. 8 is a sectional view showing a step of joining the back side of a semiconductor wafer to a ring form support substrate.

Next, the back side of the semiconductor wafer is joined to the support substrate. Joining may be carried out in accordance with the step described in the back side joining step of step S102 of the first embodiment but, as the front side of the semiconductor wafer has already undergone a mirror polishing process, it is possible, in order not to damage the front side, to place a ring form or disc form mask on the ring form support substrate and, after applying a ceramic adhesive to the support substrate, place the back side of the semiconductor wafer on the ceramic adhesive layer. This case will be described using FIG. 8. A disc form or ring form mask (center mask 2a) is placed on the center side of a ring form support substrate 4c. Also, a ring form mask (outer periphery mask 2b) is installed on the outer side of the ring form support substrate. Further, a ceramic adhesive 8 is applied between the center mask 2a and outer periphery mask 2b, an adhesive layer of a predetermined thickness formed, and a wafer attached. Subsequently, heating is carried out, thereby hardening the adhesive. By utilizing masks to form the adhesive layer, it is possible for the thickness of the adhesive to be uniform, which is preferable. Because of this, it is possible to keep the form of the wafer smooth, and thus possible to carry out a front side 1a thinning step and functional structure formation step well. As the wafer form is kept smooth and wafer handling is easy, it is preferable that the front side 1a thinning step and functional structure formation step are carried out on at least the center mask 2a together with the wafer and ring form support substrate.

Also, when using the ring form support substrate 4c, it is possible, using masks, to apply the ceramic adhesive 8 in accordance with the form of the ring form support substrate on a back side 1b of a semiconductor wafer 1. In this case, a disc form or ring form mask (the center mask 2a) is placed on the center side of the wafer. Also, a ring form mask (the outer periphery mask 2b) is installed on the outer side of the wafer. Further, the ceramic adhesive is applied between the center mask 2a and outer periphery mask 2b, and the wafer is joined to the ring form support substrate 4c. In this case too, it is possible for the thickness of the adhesive to be uniform, and thus possible to keep the form of the wafer smooth. Further, it is preferable that the thinning step and functional structure formation step are carried out with at least the center mask, semiconductor wafer, and support substrate integrated.

In the third embodiment, the functional structure formation step is such that, as the front side of the semiconductor wafer has already undergone a mirror polishing process, the functional structure is formed after the support substrate is attached. As the functional structure formation step is the same as step S104 of FIG. 1, a redundant description will be omitted.

After the functional structure is formed on the front side of the semiconductor wafer, the process proceeds to the semiconductor wafer back side processing step, but before that, the support substrate is detached from the semiconductor wafer by a detachment step. As the detachment step is the same as step S105, a redundant description will be omitted.

After the detachment step, a ring form support member is joined to the front side of the semiconductor wafer by a front side joining step. This step is the same as the front side joining step of step S106 of the second embodiment.

After the ring form support member is attached to the front side of the semiconductor wafer in accordance with the front side joining step, reinforcing the semiconductor wafer, the semiconductor wafer is thinned to a desired thickness. In the first embodiment, the thinning is carried out from the front side of the semiconductor wafer, but in the third embodiment, the thinning is carried out from the back side of the semiconductor wafer. In the semiconductor wafer thinning step, processing is carried out for reducing the thickness of the semiconductor wafer when introduced into the manufacturing step to a predetermined thickness. As a processing method, grinding may be carried out by applying a grindstone to the surface of the semiconductor wafer to which the support substrate is not attached, or CMP may be used. The thickness of the semiconductor wafer at a finishing point at which the semiconductor device is formed in the semiconductor wafer is in the region of 40 μm to 120 μm, in accordance with the breakdown voltage of the semiconductor device.

The front side of the semiconductor wafer is in a state wherein the ring form support substrate is joined to an outer peripheral region. That is, the portion of the chip formation region in which the functional structure and the like are formed is of the thickness of the semiconductor wafer, while the outer peripheral region is of a thickness that is the thickness of the support substrate added to the thickness of the semiconductor wafer. As it is difficult in this state to adsorb and fix the front side of the semiconductor wafer and carry out thinning of the back side, a stepped portion caused by the thickness of the support substrate is filled with a detachable resin, and the whole front side smoothed before adsorbing and fixing. Alternatively, the semiconductor wafer may be adsorbed to a stage having a step of the same form as the step caused by the thickness of the support substrate.

Next, a back side structure is formed in accordance with the back side processing step of step S107 of the first embodiment. Further, the support substrate is detached in accordance with the front side support substrate detachment step of step S108 of the second embodiment. Lastly, the semiconductor device is fragmented in accordance with the dicing of step S109 of the first embodiment.

(Fourth Embodiment)

The invention is also further applicable to the following kind of embodiment as an embodiment using the ring form support substrate described in the third embodiment.

In the third embodiment, a semiconductor wafer such that a mirror polishing process has been carried out on the front side of the semiconductor wafer is introduced into the manufacturing step, but in a fourth embodiment, step S101 of FIG. 1 is such that a semiconductor wafer in a state before this kind of mirror polishing process may be introduced. As in the third embodiment, it is sufficient to add a polishing step of polishing the front side of the semiconductor wafer after joining a support substrate to the back side of the semiconductor wafer. By adding a polishing step in this way, it is possible to apply a low cost semiconductor wafer in a state before mirror polishing.

Figure 2:
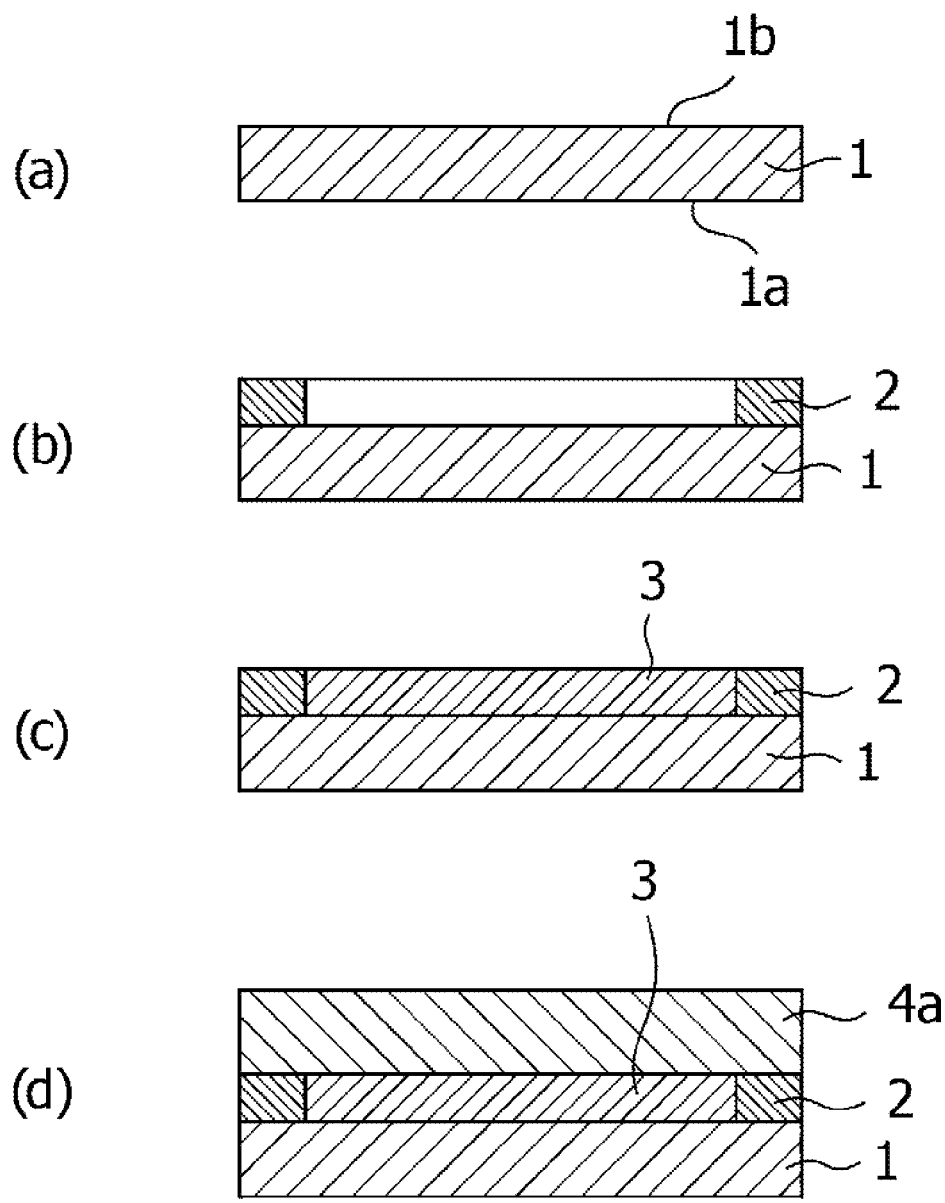
FIG. 2 is sectional views showing a back side joining step.

Referring to FIG. 2 to FIG. 7, a description will be given of the second embodiment of the semiconductor device manufacturing method of the invention. FIG. 2 is sectional views showing, of the manufacturing method of the invention, a back side joining step. With the front side 1a of the semiconductor wafer 1 facing down and the back side 1b facing up (FIG. 2(a)), a ring form mask 2 is placed on an outer peripheral portion of the back side 1b of the semiconductor wafer 1 (FIG. 2(b)). Continuing, a ceramic adhesive is applied to the back side 1b of the semiconductor wafer 1, and excess ceramic adhesive removed using a squeegee, forming a ceramic adhesive layer 3 of the same height as the mask 2 (FIG. 2(c)). Further, a support substrate 4a is placed on the ceramic adhesive layer 3 (FIG. 2(d)). Subsequently, by moisture in the ceramic adhesive layer 3 being caused to evaporate by thermal processing, thereby hardening the ceramic adhesive, it is possible to attach the support substrate 4a to the semiconductor wafer 1.

FIG. 3 is a perspective view of the mask 2. As the outer diameter of the mask 2 is the same as the outer diameter of the semiconductor wafer, it is preferable, for example, that a mask 2 with an outer diameter of six inches is used for a semiconductor wafer with an outer diameter of six inches. The surface joined to the semiconductor wafer and the surface on the side opposite thereto being smooth, it is possible for a width a to be approximately 2 mm to 5 mm. Also, the thickness of the ceramic adhesive layer 3 is determined in accordance with the height of the mask 2. For example, when the height of the mask 2 is 100 μm, the thickness of the ceramic adhesive layer 3 is also 100 μm.

In the example of FIG. 2, the ring form mask 2 is placed on an outer peripheral portion of the back side 1b of the semiconductor wafer 1, and a ceramic adhesive is applied to the back side 1b of the semiconductor wafer 1. As means differing from this, the ring form mask 2 may be placed on the support substrate 4a and, after a ceramic adhesive is applied to the support substrate 4a, the back side 1b of the semiconductor wafer 1 placed on the ceramic adhesive layer 3. By so doing, it is possible to prevent dust adhering or damage occurring to the front side 1a of the semiconductor wafer 1, because of which it is possible to keep the front side 1a clean.

Figure 4:
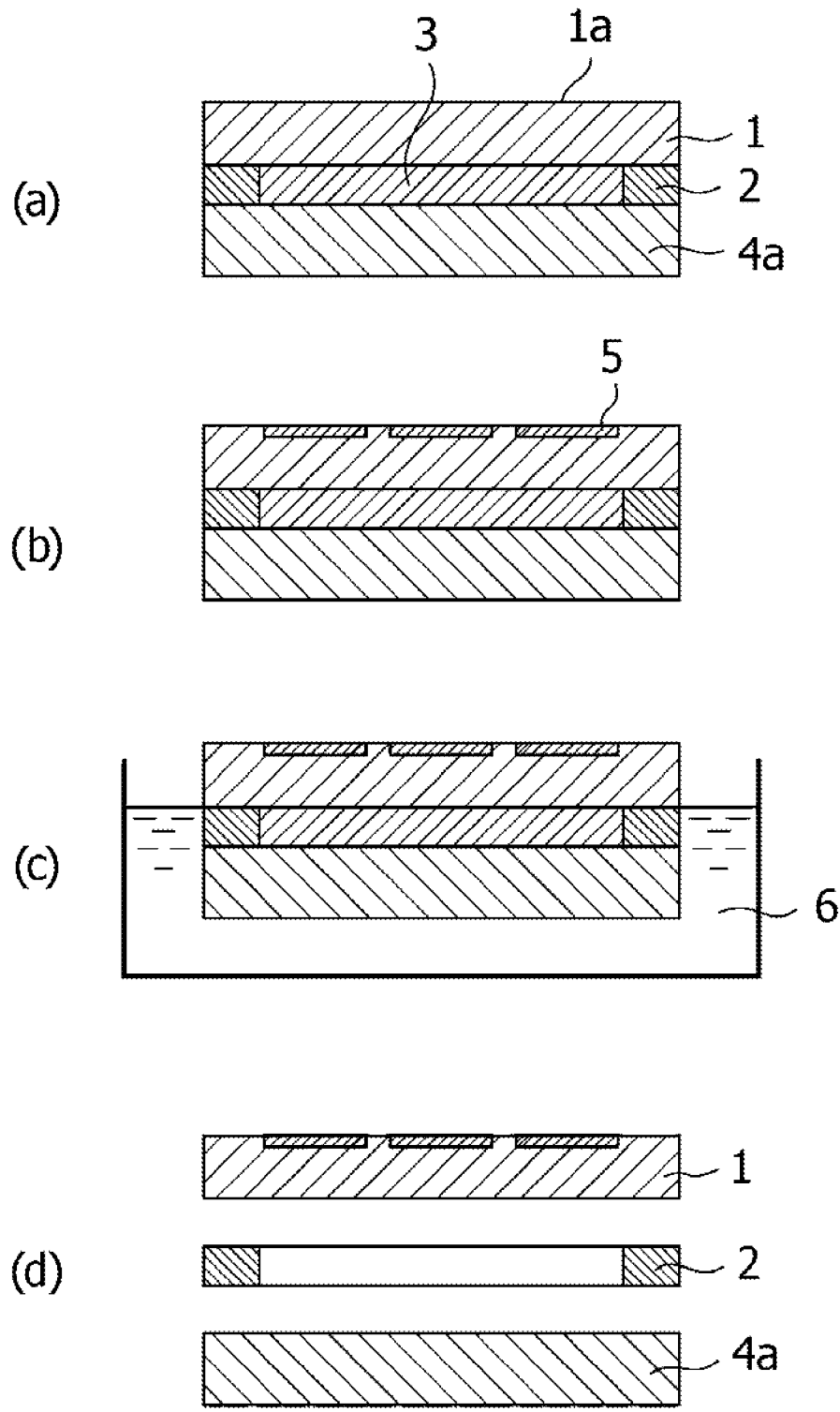
FIG. 4 is sectional views showing a functional structure formation step and a detachment step.

FIG. 4 is sectional views showing, of the manufacturing method of the invention, a functional structure formation step and a detachment step. A front side functional structure 5 is formed (FIG. 4(b)) via a guard ring formation step, gate formation step, emitter formation step, contact formation step, and the like, in the semiconductor wafer 1 to which the support substrate 4a has been attached in accordance with the step of FIG. 2 (FIG. 4(a)). After forming the front side functional structure 5, the adhesive strength of the ceramic adhesive is reduced by immersion in a tank 6 containing hot water (FIG. 4(c)), and the mask 2 and support substrate 4a are detached from the semiconductor wafer 1 (FIG. 4(d)). According to these steps, it is possible to process the front side 1a of the semiconductor wafer 1.

Figure 5:
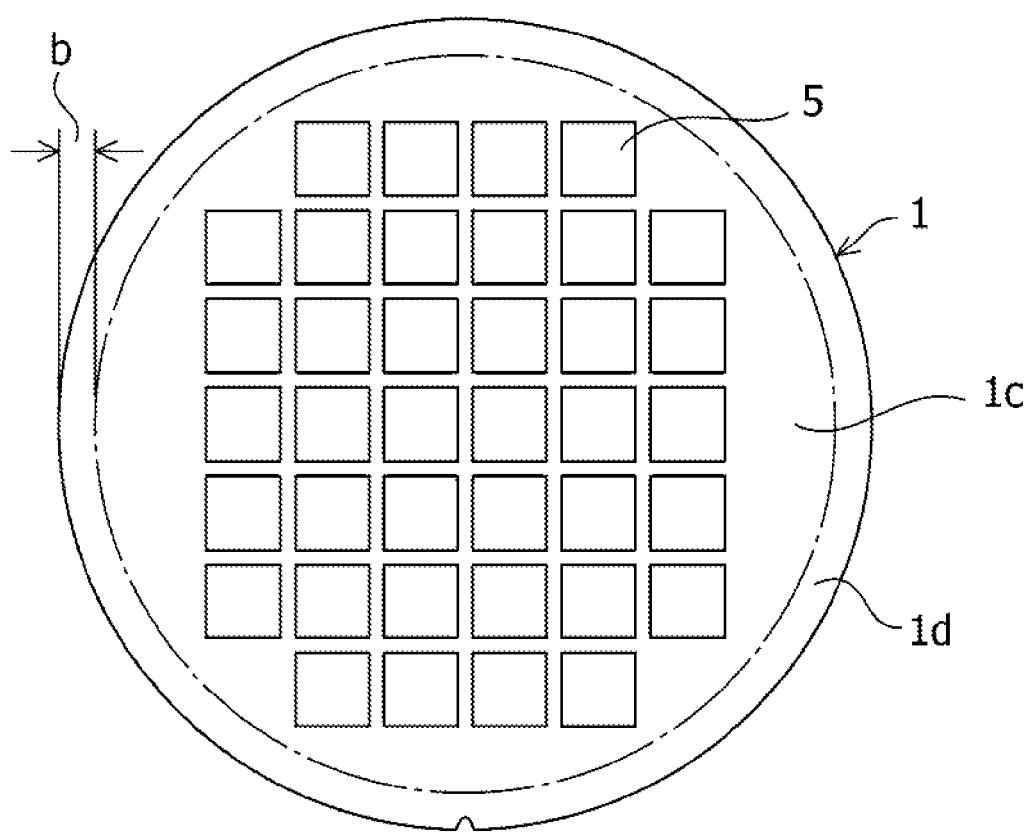
FIG. 5 is a plan view representing the front side of a semiconductor wafer after the functional structure formation step.

FIG. 5 is a plan view representing the front side of the semiconductor wafer after the functional structure formation step. The front side 1a of the semiconductor wafer 1 can be divided into a functional structure formation region 1c, which is a region in which a functional structure is formed, and an outer peripheral region 1d in which no functional structure is formed. The front side functional structure 5 is formed in the functional structure formation region 1c. It is preferable that the width a of the mask is of the same extent as a width b of the outer peripheral region.

Figure 6:
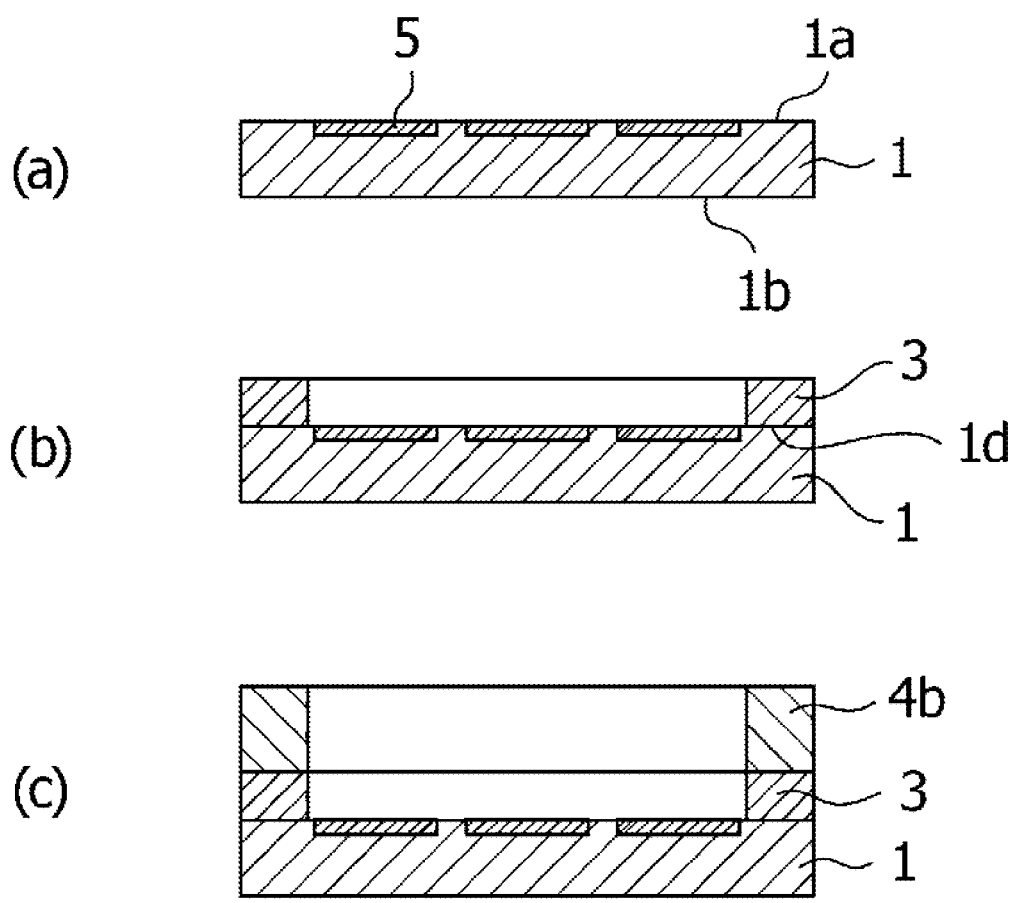
FIG. 6 is sectional views showing a front side joining step.

FIG. 6 is sectional views showing, of the manufacturing method of the invention, a front side joining step. With the back side 1b of the semiconductor wafer 1 facing down and the front side 1a facing up (FIG. 6(a)), the ceramic adhesive layer 3 is formed in the outer peripheral region 1d of the front side 1a of the semiconductor wafer 1 (FIG. 6(b)). Continuing, a ring form support substrate 4b is placed on the ceramic adhesive layer 3 (FIG. 6(c)). Subsequently, by moisture in the ceramic adhesive layer 3 being caused to evaporate by thermal processing, thereby hardening the ceramic adhesive, it is possible to attach the support substrate 4b to the semiconductor wafer 1. As the support substrate 4b is such that the surface joined to the semiconductor wafer and the surface on the side opposite thereto are smooth, in the same way as the mask 2 shown in FIG. 3, it is possible for the width thereof to be approximately 2 mm to 5 mm in accordance with the width b of the outer peripheral region. Also, as the outer diameter of the support substrate 4b is the same as the outer diameter of the semiconductor wafer, it is preferable, for example, that a support substrate 4b with an outer diameter of six inches is used for a semiconductor wafer with an outer diameter of six inches. The thickness of the support substrate 4b can be, for example, 300 μm, a thickness that can provide strength of an extent that can reinforce so that no deformation or warping occurs in the semiconductor wafer being sufficient. The ring form support substrate 4b is joined to the semiconductor wafer in a region of the outer peripheral region 1d of the semiconductor wafer 1. Because of this, no damage is caused by the joining of the support substrate 4b to the already formed front side functional structure 5.

Figure 7:
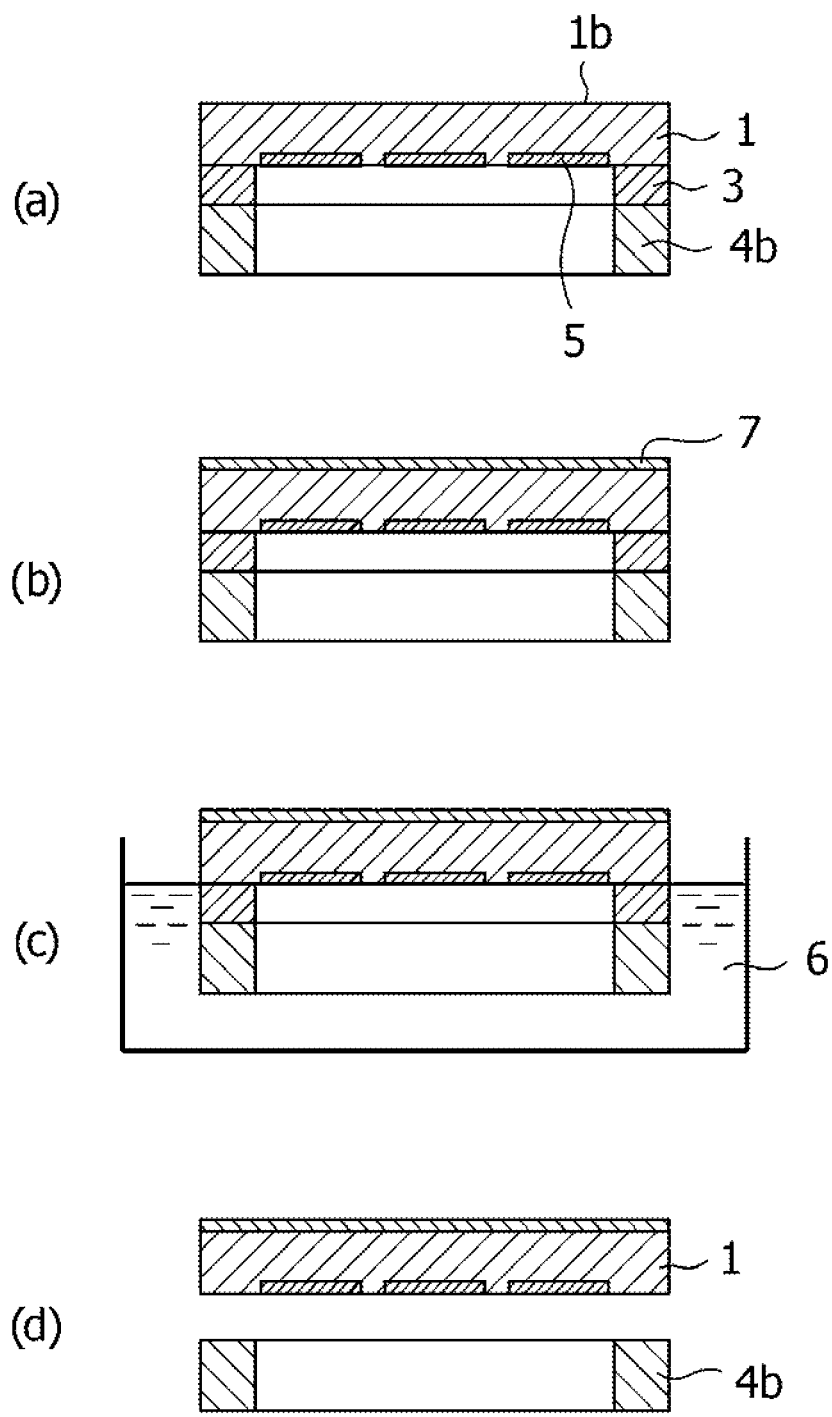
FIG. 7 is sectional views showing a back side processing step and front side support substrate detachment step.

FIG. 7 is sectional views showing a back side processing step and front side support substrate detachment step of the manufacturing method of the invention. A back side structure 7 is formed (FIG. 7(b)) via steps including an ion implantation and thermal processing, electrode formation, and the like, on the semiconductor wafer 1 to which the support substrate 4b has been joined in accordance with the steps of FIG. 6 after processing the front side 1a of the semiconductor wafer 1 in accordance with the steps of FIG. 4 (FIG. 7(a)). Also, polishing or the like may be carried out before forming the back side structure 7. After forming the back side structure 7, the adhesive strength of the ceramic adhesive is reduced by immersion in the tank 6 containing hot water (FIG. 7(c)), and the support substrate 4b is detached from the semiconductor wafer 1 (FIG. 7(d)). According to these steps, it is possible to process the back side 1b of the semiconductor wafer 1.

According to the method described in FIG. 2 to FIG. 7, it is possible to manufacture a semiconductor device. According to the method, it is possible to manufacture a semiconductor device without problem, even when including high temperature processing with in the region of 1,000° C. as a diffusion temperature when forming the front side functional structure 5 and back side structure 7.

EXAMPLES

Hereafter, the invention will be described based on examples, but the invention is not limited by the examples.
(Support Substrate Attachment)

Example 1

An Si wafer with a six inch diameter and thickness of 500 μm is adopted as a semiconductor wafer, and a ring form mask (made of molybdenum, outer diameter six inches, width 3 mm, height 100 μm) is placed on the outer periphery of the back side of the semiconductor wafer. Then, a ceramic adhesive with a viscosity of 50,000 mPa·s (20° C.), including ceramic particles having alumina ($Al_2O_3$) as a main element and an alkali metal salt soluble in water as an additive, is mixed thoroughly and applied to the back side of the semiconductor wafer, and excess ceramic adhesive is removed using a squeegee, forming a ceramic adhesive layer with a height of 100 μm, the same as that of the mask. Subsequently, a support substrate (made of highly heat resistant glass, outer diameter six inches, thickness 300 μm) is bonded to the back side of the semiconductor wafer across the ceramic adhesive layer, and the ceramic adhesive is hardened by a thermal processing being carried out at 100° C. for two hours, removing the moisture from the ceramic adhesive layer.

Example 2

A support substrate is attached to the back side of a semiconductor wafer in accordance with a method the same as Example 1, except for using a ceramic adhesive wherein the ceramic particles have silica ($SiO_2$) as a main element.

Example 3

A support substrate is attached to the back side of a semiconductor wafer in accordance with a method the same as Example 1, except for using a ceramic adhesive wherein the ceramic particles have zirconia ($ZrO_2$) as a main element.
(Heat Resistance Test)

A heat resistance test and heat cycle test have been performed in order to confirm whether the semiconductor wafers and attached support substrates of Example 1, Example 2, and Example 3 are applicable to a high temperature processing at 1,000° C. The heat resistance test is carried out under a condition whereby the semiconductor wafers of Example 1, Example 2, and Example 3 are exposed for two hours under a condition of 1,100° C., and the presence or otherwise of abnormality in the adhesiveness of the ceramic adhesive or on the semiconductor wafer is evaluated. The results show no abnormality in the adhesiveness of the ceramic adhesive or on the semiconductor wafer for the semiconductor wafer in any of Example 1, Example 2, or Example 3.
(Heat Cycle Test)

The heat cycle test monitors changes in the mechanical and physical characteristics of the semiconductor wafer in response to temperature change by repeatedly exposing the semiconductor wafers of Example 1, Example 2, and Example 3 to high temperature and low temperature environments after performing the heretofore described heat resistance test. With the temperature conditions such that one cycle is −40° C. for 30 minutes, 25° C. for 30 minutes, and 150° C. for 30 minutes, ten cycles are performed. No abnormality is observed in the adhesiveness of the ceramic adhesive or in the semiconductor wafer for the semiconductor wafer in any of Example 1, Example 2, or Example 3.

According to the heretofore described examples, it is possible according to the invention to provide a method for attaching a support substrate to a semiconductor wafer applicable to high temperature processing at in the region of 1,000° C., and a semiconductor device manufacturing method.

REFERENCE SIGNS LIST

1 Semiconductor wafer
1a Semiconductor wafer front side
1b Semiconductor wafer back side
1c Functional structure formation region
1d Outer peripheral region
2 Mask
2a Center mask
2b Outer periphery mask
3 Ceramic adhesive layer
4a, 4b Support substrate
4c Ring form support substrate
5 Front side functional structure
6 Tank
7 Back side structure
8 Ceramic adhesive
a Mask width
b Outer peripheral region width
S101 Semiconductor wafer introduction
S102 Back side joining step
S103 Thinning step
S104 Functional structure formation step
S105 Detachment step
S106 Front side joining step
S107 Back side processing step
S108 Front side support substrate detachment step
S109 Dicing

The invention claimed is:

1. A semiconductor device manufacturing method, including:
joining a support substrate to a back side of a semiconductor wafer using an intermediate layer including a ceramic adhesive layer and a mask surrounding an outer periphery of the ceramic adhesive layer, such that the ceramic adhesive layer and the mask both contact the back side of the semiconductor wafer, the joined support substrate, intermediate layer, and semiconductor wafer forming a joined body;
forming a functional structure on a front side of the semiconductor wafer in a region excluding a region corresponding to a width of the mask;
detaching the support substrate from the semiconductor wafer by removing the ceramic adhesive layer to thereby separate the mask from the semiconductor wafer; and
carrying out back side processing on the back side of the semiconductor wafer.

2. The semiconductor device manufacturing method according to claim 1, wherein detaching the support substrate from the semiconductor wafer includes:
washing the joined body of the semiconductor wafer and the support substrate in water to weaken the ceramic adhesive layer; and
removing the mask and the ceramic adhesive layer from the semiconductor wafer.

3. The semiconductor device manufacturing method according to claim 1, wherein the ceramic adhesive layer includes at least one inorganic oxide selected from the group consisting of $Al_2O_3$, $SiO_2$ and $ZrO_2$.

4. The semiconductor device manufacturing method according to claim 1, further comprising, before carrying out back side processing on the back side of the semiconductor wafer, joining a ring form support substrate to an outer peripheral region of the front side of the semiconductor wafer, the outer peripheral region having no functional structure being formed therein.

5. The semiconductor device manufacturing method according to claim 4, wherein the joining of the ring form support substrate is carried out with another ceramic adhesive, the another ceramic adhesive including at least one inorganic oxide selected from the group consisting of $Al_2O_3$, $SiO_2$ and $ZrO_2$.

6. The semiconductor device manufacturing method according to claim 4, wherein after carrying out back side processing on the back side of the semiconductor wafer, immersing the ring form support substrate in water to remove the ring form support substrate from the semiconductor wafer.

7. The semiconductor device manufacturing method according to claim 6, wherein during the immersing, the semiconductor wafer is not immersed.

8. The semiconductor device manufacturing method according to claim 1, wherein a thickness of the ceramic adhesive layer is 50 μm to 200 μm.

9. The semiconductor device manufacturing method according to claim 1, wherein the semiconductor wafer is a wafer selected from the group consisting of an Si wafer, an SiC wafer, and a GaN wafer.

10. The semiconductor device manufacturing method according to claim 1,
wherein a thickness of the semiconductor wafer before joining the support substrate to the back side of the semiconductor wafer is less than 300 μm and the semiconductor wafer has a six inch diameter, or
wherein a thickness of the semiconductor wafer before joining the support substrate to the back side of the semiconductor wafer is less than 400 μm and the semiconductor wafer has an eight inch diameter.

11. The semiconductor device manufacturing method according to claim 1, wherein the support substrate is a substrate selected from the group consisting of a highly heat resistant glass, a Si wafer, a Si wafer having a silicon oxide film layer on a surface, and an SiC wafer.

12. The semiconductor device manufacturing method according to claim 1, wherein detaching the support substrate from the semiconductor wafer includes detaching the ceramic adhesive layer and the mask from the semiconductor wafer.

13. The semiconductor device manufacturing method according to claim 12, wherein detaching the support substrate from the semiconductor wafer includes immersing the support substrate, the ceramic adhesive layer and the mask in water.

14. The semiconductor device manufacturing method according to claim 13, wherein during the immersing, the semiconductor wafer is not immersed.

15. The semiconductor device manufacturing method according to claim 1, wherein detaching the support substrate from the semiconductor wafer occurs after forming the functional structure on the front side of the semiconductor wafer.

* * * * *